United States Patent
Fukasaku

(10) Patent No.: US 7,939,895 B2
(45) Date of Patent: May 10, 2011

(54) SEMICONDUCTOR DEVICE WITH FORWARDLY TAPERED P-TYPE FET GATE ELECTRODE AND REVERSELY TAPERED N-TYPE FET GATE ELECTRODE AND METHOD OF MANUFACTURING SAME

(75) Inventor: Katsuhiko Fukasaku, Kanagawa (JP)

(73) Assignee: Sony Corporation, Tokyo (JP)

( * ) Notice: Subject to any disclaimer, the term of this patent is extended or adjusted under 35 U.S.C. 154(b) by 280 days.

(21) Appl. No.: 12/204,521

(22) Filed: Sep. 4, 2008

(65) Prior Publication Data

US 2009/0057771 A1 Mar. 5, 2009

(30) Foreign Application Priority Data

Sep. 5, 2007 (JP) ................................. 2007-229723

(51) Int. Cl.
*H01L 21/70* (2006.01)
(52) U.S. Cl. . 257/369; 257/204; 257/206; 257/E21.632; 257/E21.635; 257/E21.636; 257/E21.637; 257/E21.638; 257/E27.062; 257/E27.064; 257/E27.108; 257/E29.134; 257/E29.135
(58) Field of Classification Search ........... 257/E21.635, 257/204, 206, 369, E21.632, E21.636, E21.637, 257/E21.638, E27.062, E27.064, E27.108, 257/E29.134, E29.135
See application file for complete search history.

(56) References Cited

U.S. PATENT DOCUMENTS

| | | | | |
|---|---|---|---|---|
| 4,394,182 A | * | 7/1983 | Maddox, III | 438/163 |
| 5,877,530 A | * | 3/1999 | Aronowitz et al. | 257/344 |
| 6,060,375 A | * | 5/2000 | Owyang et al. | 438/585 |
| 6,107,148 A | * | 8/2000 | Taki | 438/303 |
| 6,191,044 B1 | * | 2/2001 | Yu et al. | 438/713 |
| 6,433,871 B1 | * | 8/2002 | Lensing et al. | 356/450 |
| 6,524,916 B1 | * | 2/2003 | Scholer et al. | 438/270 |
| 6,838,777 B2 | * | 1/2005 | Igarashi | 257/339 |
| 7,151,031 B2 | * | 12/2006 | Kwon et al. | 438/275 |
| 7,208,361 B2 | * | 4/2007 | Shah et al. | 438/199 |
| 7,235,469 B2 | * | 6/2007 | Okayama et al. | 438/517 |
| 2002/0163036 A1 | * | 11/2002 | Miura et al. | 257/336 |

(Continued)

FOREIGN PATENT DOCUMENTS

JP 2003-224265 8/2003

(Continued)

OTHER PUBLICATIONS

Kensuke Takahashi et al.; Dual Workfunction Ni-Silicide/HfSiON Gate Stacks by Phase-Controlled Full-Silicidation (PC-FUSI) Technique for 45nm-node LSTP and LOP Devices; IEDM; 2004; p. 91.

(Continued)

*Primary Examiner* — Kenneth A Parker
*Assistant Examiner* — Jay C Kim
(74) *Attorney, Agent, or Firm* — SNR Denton US LLP

(57) ABSTRACT

Disclosed herein is a semiconductor device including a semiconductor substrate provided with an N-type FET and P-type FET, with a gate electrode of the N-type FET and a gate electrode of the P-type FET having undergone full-silicidation, wherein the gate electrode of the P-type FET has such a sectional shape in the gate length direction that the gate length decreases as one goes upwards from a surface of the semiconductor substrate, and the gate electrode of the N-type FET has such a sectional shape in the gate length direction that the gate length increases as one goes upwards from the surface of the semiconductor substrate.

4 Claims, 10 Drawing Sheets

U.S. PATENT DOCUMENTS

2003/0227055 A1* 12/2003 Bae et al. .................. 257/346

FOREIGN PATENT DOCUMENTS

| JP | 2006-032410 | 2/2006 |
|----|-------------|--------|
| JP | 2006-140319 | 6/2006 |

OTHER PUBLICATIONS

Motofumi Saitoh et al.; Strain Controlled CMOSFET with Phase Controlled Full-sillicide (PC-FUSI)HfSiON Gate Stack STructure for 45nm-node LSTP Devices; 2006 Smposium on VLSI Technology Digest of Technical Papers.

* cited by examiner

GATE VOLUME IS DECREASED, AND
EXPANSION AMOUNT IS DECREASED

GATE VOLUME IS INCREASED, AND
EXPANSION AMOUNT IS INCREASED

CHANNEL MOBILITY    NICKEL OOZES
IS DETERIORATED

FIG.4A
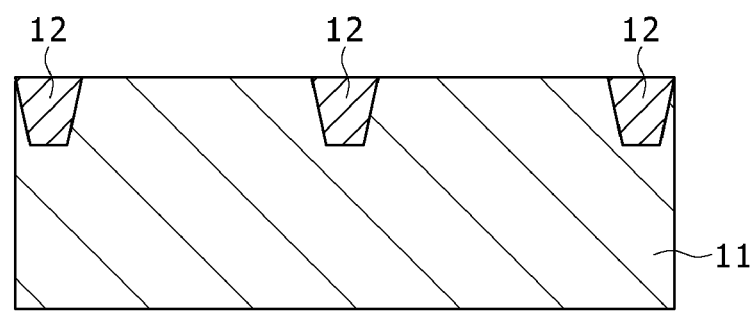
FIG.4B
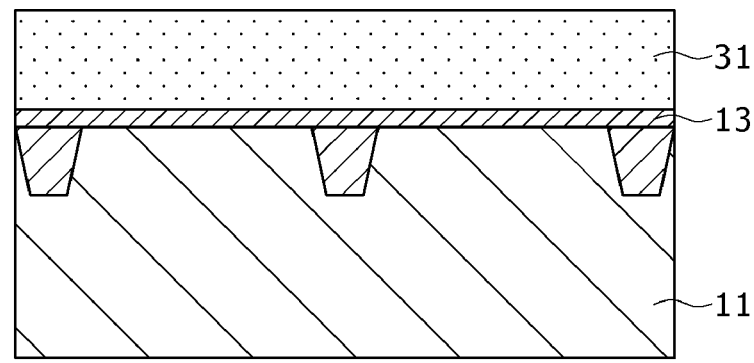
FIG.4C
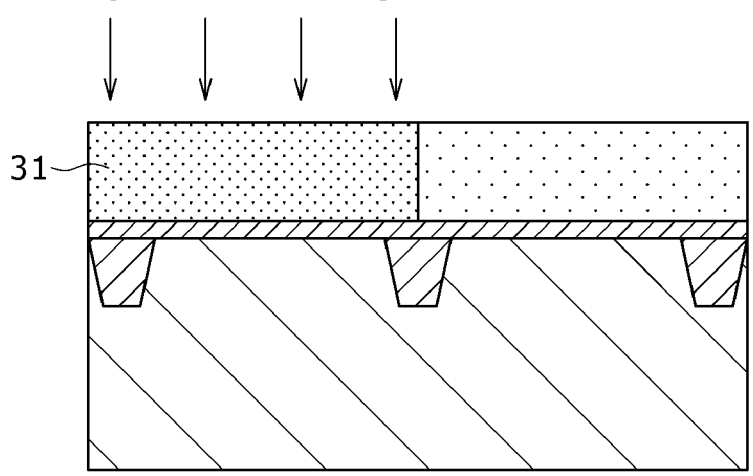

SEMICONDUCTOR DEVICE WITH FORWARDLY TAPERED P-TYPE FET GATE ELECTRODE AND REVERSELY TAPERED N-TYPE FET GATE ELECTRODE AND METHOD OF MANUFACTURING SAME

CROSS REFERENCES TO RELATED APPLICATIONS

The present invention contains subject matter related to Japanese Patent Application JP 2007-229723 filed in the Japan Patent Office on Sep. 5, 2007, the entire contents of which being incorporated herein by reference.

BACKGROUND OF THE INVENTION

1. Field of the Invention

The present invention relates to a semiconductor device and a method of manufacturing the same.

2. Description of the Related Art

The full-silicide (FUSI) technologies in which a gate electrode is fully silicided have been reported by various research institutes as a promising technology for suppressing the gate depletion that has come to be conspicuous in the very thin gate insulator films of the 90 nm node and latter nodes.

Among other full-silicide technologies, a full-silicide gate structure using nickel is deemed to be promising, in view of simplicity of process and ease of production of a thin film silicide. In relation to the nickel full-silicide gate, a structure has been reported in which the respective nickel and silicon contents in an N-type FET and a P-type FET are varied for the purpose of optimizing the respective gate electrode work functions for the N-type FET and the P-type FET (refer to, for example, Dual Workfunction NiSilicide/HfSiON Gate Stacks by Phase-controlled Full-Silicidation (PC FUSI) Technique for 45 nm-node LSTP and LOP Devices (K. Takahashi, 2004, IEDM, p. 91), hereinafter referred to as Non-Patent Document 1). A compositional ratio (content ratio) ensuring that the N-type FET gate electrode is of an $NiSi_2$ structure and the P-type FET gate electrode is of an $Ni_3Si$ type is desirable from the viewpoint of work function.

It has been reported, however, that in the case of forming an $Ni_3Si$ type full-silicide gate structure, the volume expansion in the process of reaction between nickel and silicon is excessively large, and the load of the resultant stress causes the problem that nickel oozes from gate ends into the channel region (refer to, for example, Strain Controlled CMOSFET with Phase Controlled Full-Silicide (PC-FUSI)/HfSiON Gate Stack Structure for 45 nm-node LSTP Devices (M. Saitoh, 2006 Symp. On VLSI tech.), hereinafter referred to as Non-Patent Document 2). As a countermeasure against this problem, it has been practiced to vary the amount of silicon brought into reaction with nickel depending respectively on the N type and the P type, i.e., to vary the initial amount of silicon to be brought into reaction depending respectively on the N type and the P type.

The full-silicide gate structure in the related art is generally produced by a process in which gate electrode surface layers are exposed by the CMP (Chemical Mechanical Polishing) technique, followed by silicidation reactions (refer to, for example, Japanese Patent Laid-open No. 2006-140319, hereinafter referred to as Patent Document 1, FIG. 9). An example has been known in which the problem arising from volume expansion is suppressed by controlling the initial amounts of gate silicon at the time of conducting silicidation reactions respectively for the N-type FET and the P-type FET after the gate electrode surface layers are exposed by CMP (refer to, for example, Non-Patent Document 2).

However, the technology in which etch-back is carried out after the respective gate electrode heights of the N-type FET and the P-type FET are controlled would disadvantageously lead to dispersions of electrical characteristics through dispersion of in-plane evenness in the RIE (Reactive Ion Etching) process.

In view of this, a method in which the initial poly-silicon amounts are controlled taking into account the volume expansion in the gate silicidation reactions has been improved by control of gate heights and gate shapes, and, as a related art, a structure has been known in which the upper ends of gates are rounded (refer to, for example, FIG. 9 of Japanese Patent Laid-open No. 2006-32410, hereinafter referred to as Patent Document 2, and FIG. 1 of Japanese Patent Laid-open No. 2003-224265, hereinafter referred to as Patent Document 3).

Besides, as a method in which other factor than gate height is controlled, there is a method in which the gate shape is controlled to be a tapered shape for the purpose of reducing the volume expansion of the gate of the P-type FET. However, if the N-type gate is simultaneously provided with the same shape as the P-type gate in this method, the volume expansion of the N-type gate is insufficient, so that the stress exerted on the channel part is reduced and the ON current cannot be increased.

SUMMARY OF THE INVENTION

In the case where the shape of a gate of a P-type FET is controlled to be a tapered shape in order to reduce the volume expansion of the gate, if a gate of an N-type FET is also controlled to be a tapered shape, the volume expansion of the N-type FET would be insufficient, so that a stress exerted on the channel part is reduced, and the ON current cannot be increased.

On the other hand, where the sectional shape of a P-type FET is set to be a forwardly tapered shape and the sectional shape of an N-type FET is set to be a reversely tapered shape, it is possible to enhance the mobility in the P-type FET and to increase the ON current in the N-type FET.

In accordance with first embodiment of the present invention, there is provided a semiconductor device including a semiconductor substrate provided with an N-type FET and P-type FET, with a gate electrode of the N-type FET and a gate electrode of the P-type FET having undergone full-silicidation. In the semiconductor device, the gate electrode of the P-type FET has such a sectional shape in the gate length direction that the gate length decreases as one goes upwards from a surface of the semiconductor substrate, and the gate electrode of the N-type FET has such a sectional shape in the gate length direction that the gate length increases as one goes upwards from the surface of the semiconductor substrate.

In the semiconductor device according to the first embodiment of the present invention, the sectional shape in the gate length direction of the P-type FET gate electrode is a forwardly tapered shape such that the gate length decreases as one goes upwards from the semiconductor substrate surface, so that the expansion amount at the time of full-silicidation can be reduced because the gate electrode is small in volume. Therefore, oozing of the metal as a material for a silicide into the channel region is suppressed, and deterioration of the channel mobility is suppressed.

In addition, the sectional shape in the gate length direction of the N-type FET gate electrode is a reversely tapered shape such that the gate length increases as one goes upwards from the semiconductor substrate surface, so that an expansion amount at the time of full-silicidation can be increased because the volume of the gate electrode is larger than that of a gate electrode in the related art which is not set to have a tapered sectional shape. Therefore, a stress exerted on the channel part can be increased, and the ON current can be increased.

In accordance with second embodiment of the present invention, there is provided a method of manufacturing a semiconductor device in which, at the time of providing a semiconductor substrate with an N-type FET and a P-type FET, a gate electrode of the N-type FET and a gate electrode of the P-type FET are subjected to full-silicidation. The method includes the steps of: forming the gate electrode of the P-type FET into such a sectional shape in the gate length direction that the gate length decreases as one goes upwards from a surface of the semiconductor substrate; forming the gate electrode of the N-type FET into such a sectional shape in the gate length direction that the gate length increases as one goes upwards from the surface of the semiconductor substrate; thereafter forming a mask over the gate electrode of the P-type FET and subjecting only the gate of said N-type FET to full-silicidation; and forming a mask over the gate electrode of the N-type FET and subjecting only the gate electrode of the P-type FET to full-silicidation.

In the method of manufacturing a semiconductor substrate according to the second embodiment of the present invention, the P-type FET gate electrode is formed to have such a forwardly tapered sectional shape in the gate length direction that the gate length is decreases as one goes upwards from the semiconductor substrate surface, so that the expansion amount at the time of full-silicidation can be reduced because the volume of the gate electrode is small. Therefore, oozing of the metal as a material for a silicide into the channel region is suppressed, and deterioration of the channel mobility is suppressed.

Besides, the N-type FET gate electrode is formed to have such a reversely tapered sectional shape that the gate length increases as one goes upwards from the semiconductor substrate surface, so that the expansion amount at the time of full-silicidation can be increased because the volume of the gate electrode is greater than that of a gate electrode in the related art which is not set to have a tapered sectional shape. Therefore, the stress exerted on the channel part can be increased, and the ON current can be increased.

In the semiconductor device according to the first embodiment of the present invention, the stress exerted on the channel part in the N-type FET can be increased, so that the ON current can be increased. Besides, in the P-type FET, the oozing of the metal as a material for a silicide into the channel region is suppressed, and deterioration of the channel mobility can be suppressed. Thus, the performance and reliability of the FETs can be enhanced advantageously.

In the method of manufacturing a semiconductor device according to the second embodiment of the present invention, the stress exerted on the channel part in the N-type FET can be increased, so that the ON current can be increased. Besides, in the P-type FET, the oozing of the metal as a material for a silicide into the channel region is suppressed, so that deterioration of the channel mobility can be suppressed. Thus, the performance and reliability of the FETs can be enhanced advantageously.

DETAILED DESCRIPTION OF THE PREFERRED EMBODIMENT

Now, an embodiment of the semiconductor device based on the present invention will be described below referring to a schematic configuration sectional view shown in FIG. 1.

Figure 1:
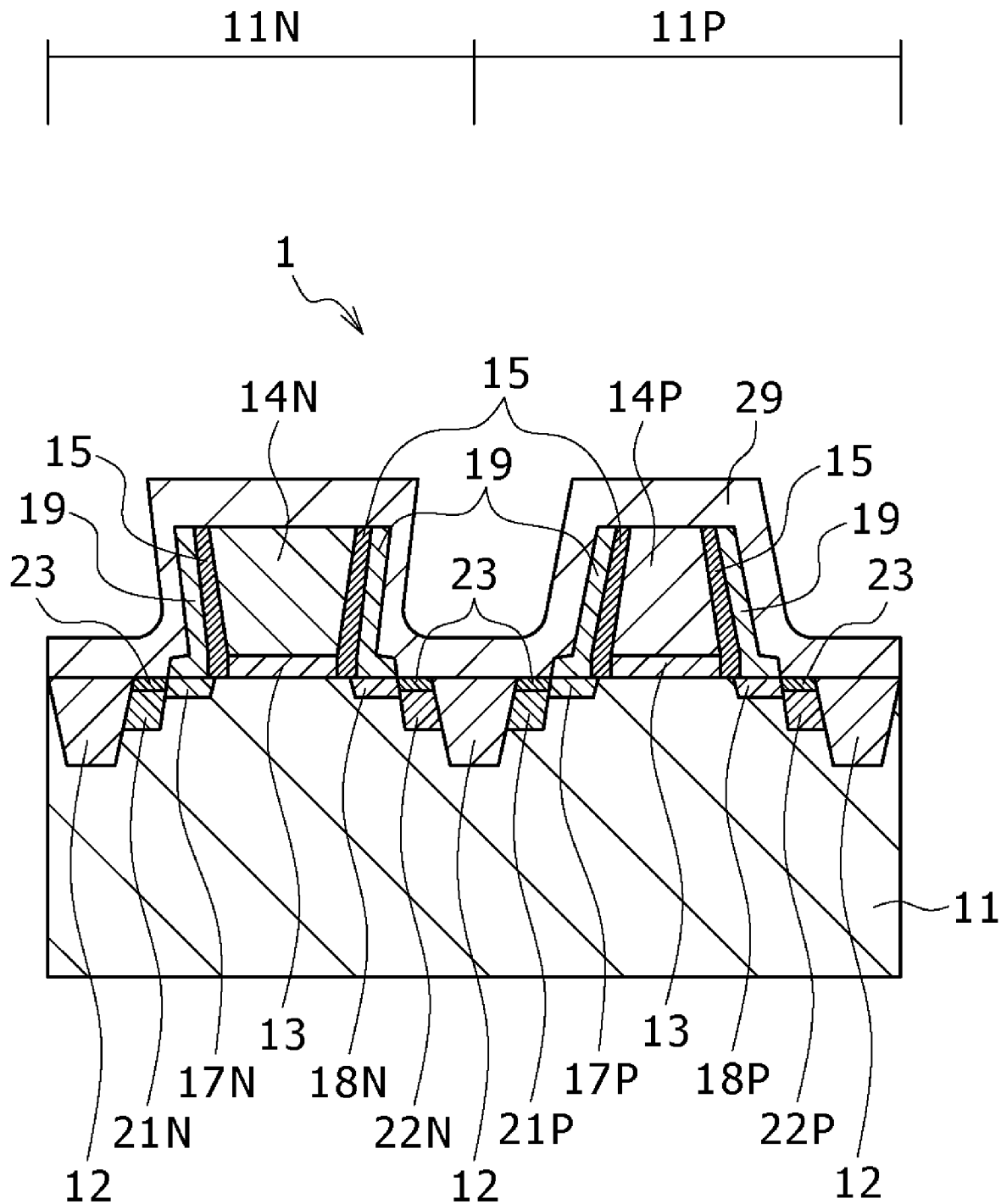
FIG. 1 is a schematic configuration sectional view showing an embodiment of the semiconductor device based on the present invention.

As shown in FIG. 1, device isolation regions 12 for isolating an N-type FET (for example, N-type MOSFET) formation region 11N and a P-type FET (for example, P-type MOSFET) formation region 11P from each other are formed in a semiconductor substrate 11. As the semiconductor substrate 11, for example, a silicon substrate is used. Naturally, a compound semiconductor substrate can also be used. Optimum channel impurities are introduced respectively into the formation regions 11N and 11P.

The semiconductor substrate 11 is provided with a gate electrode 14N and a gate electrode 14P, with a gate insulator film 13 interposed therebetween. The gate insulator film 13 includes, for example, a high dielectric constant film, examples of which include a hafnium nitride silicate (Hf-SiON) film.

The gate electrode 14P is formed in a sectional shape (sectional shape in the gate length direction) which is a forwardly tapered shape (normal tapered shape) In addition, the gate electrode 14N is formed in a sectional shape (sectional shape in the gate length direction) which is a reversely tapered shape (inverted tapered shape). The sectional shapes of the gate electrodes 14N, 14P will be described in detail later.

At side walls of the gate electrodes 14N and 14P, offset spacers 15 and side wall spacers 19 are formed by using, for example, a silicon nitride film, a silicon oxide film or the like. Further, the semiconductor substrate 11 is provided on both sides of the gate electrode 14N with source/drain regions 21N and 22N, with source/drain extension pocket regions 17N and 18N interposed therebetween. Besides, the semiconductor substrate 11 is provided on both sides of the gate electrode 14P with source/drain regions 21P and 22P, with source/drain extension pocket regions 17P and 18P interposed therebetween.

A silicide layer 23 is formed over each of the source/drain regions 21N, 22N, 21P, 22P. The silicide layer 23 has nickel silicide, for example. Further, a high stress film 29 having a stress is formed in a thickness of, for example, 60 nm as a contact etching stop layer (CESL) so as to cover the gate electrodes 14N, 14P.

While nickel has been used as a material of the silicide in the description above, the material of the silicide may be any metallic material that can form silicides differing in work function at the gate electrode 14N of the N-type FET and the gate electrode 14P of the P-type FET. While nickel has been mentioned as a representative of the material of the silicide, platinum (Pt) may also be used as the material of the silicide.

In this manner, the semiconductor device 1 is configured in which the gate electrode 14P of the P-type FET and the gate electrode 14N of the N-type FET have undergone full-silicidation.

Now, referring to schematic configuration sectional vies shown in FIG. 2, the shapes of the gate electrodes 14N and 14P will be described.

Figure 2:
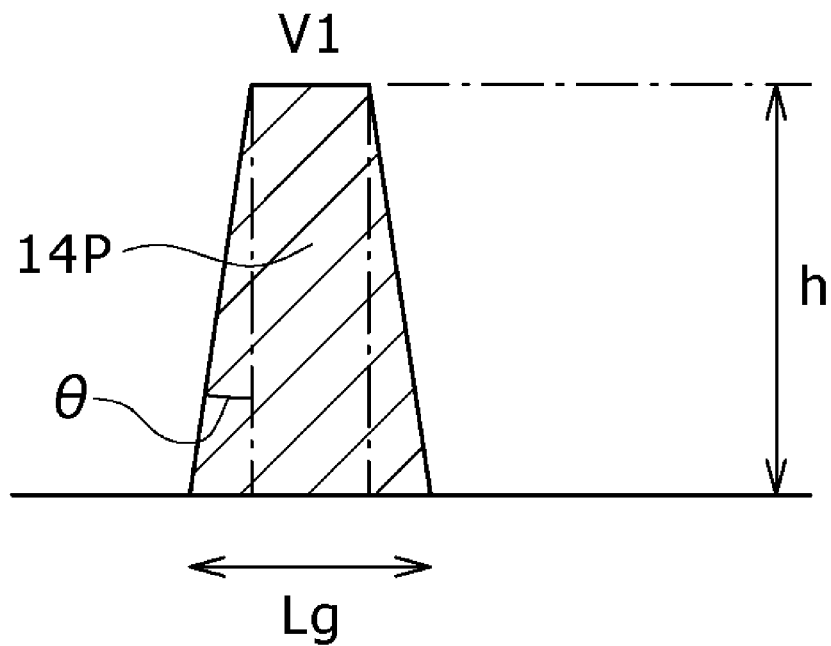
FIG. 2 shows schematic configuration sectional views for showing the details of gate electrodes.
Figure 2:
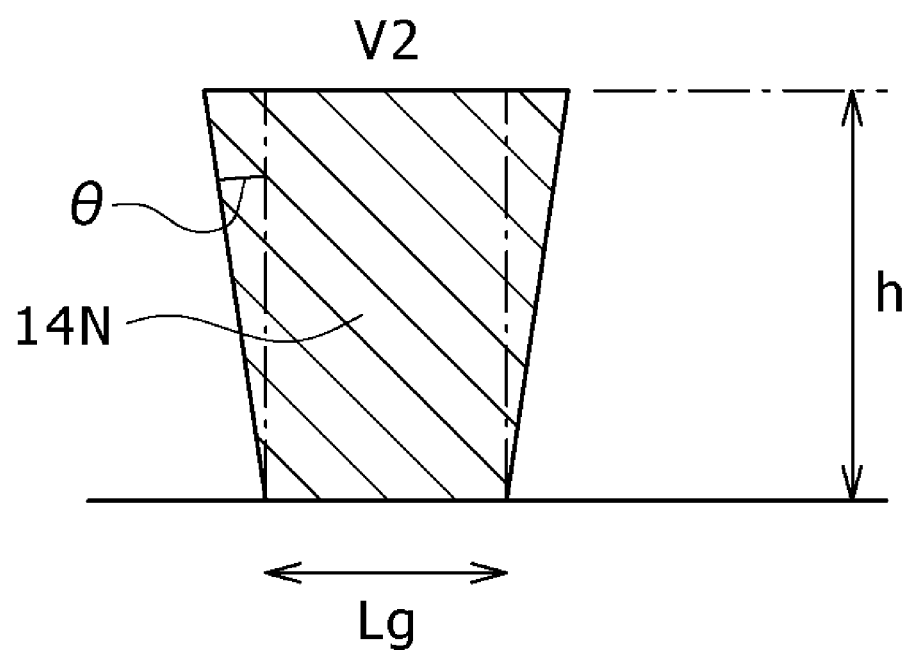

As shown in FIG. 2, N- and P-type gate shapes are separately set, without increasing dispersions of characteristics and with gate heights and gate lengths as they are. For example, the gate shapes in the case where the taper angle θ of the tapered shapes is set to be θ=10° as an example will be described.

The taper angle θ can be calculated as follows, from the sizes and layout of the gate electrodes. Here, let the sectional areas in the gate length direction of the gate electrodes be V1 and V2, let the length in the gate length direction at the lower surface of each gate electrode be Lg, and the height of each gate electrode be h, then, the relations of:

$$V1 = h/2(Lg + Lg - 2h\tan\theta)$$
$$= h(Lg - h\tan\theta)$$
$$V2 = h/2(Lg + Lg + 2h\tan\theta)$$
$$= h(Lg + h\tan\theta)$$

are obtained. It is seen that, for example for obtaining an optimum volume ratio of V1:V2=1:2, θs=9.46° (taper shape of about 10°) is desirable in the structure wherein Lg=50 nm and h=150 nm. Θ can be set in accordance with V1, V2, Lg and h as needed.

Figure 3A:
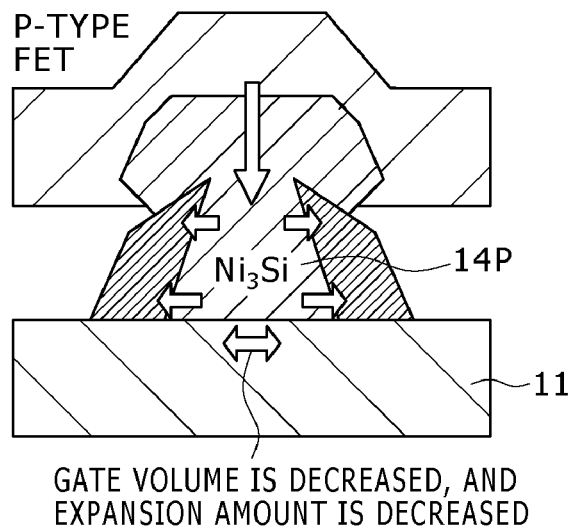
FIGS. 3A to 3C are schematic configuration sectional views for illustrating the operations or effects of the gate electrode.

In the semiconductor device 1 as above, as shown in FIG. 3A, the sectional shape in the gate length direction of the gate electrode 14P of the P-type FET is a forwardly tapered shape in which the gate length decreases as one goes upwards from the surface of the semiconductor substrate 11. Therefore, since the gate electrode 14P is reduced in volume, the expansion amount at the time of full-silicidation ($Ni_3Si$) can be reduced. Consequently, oozing of nickel (Ni) into the channel region is suppressed, and deterioration of channel mobility can be suppressed. Besides, since the gate electrode 14P is reduced in volume, the concentration of nickel (Ni) to be silicided in relation to silicon is enhanced, and optimum full-silicidation ($Ni_3Si$) for the gate electrode 14P of the P-type FET can be realized.

Figure 3B:
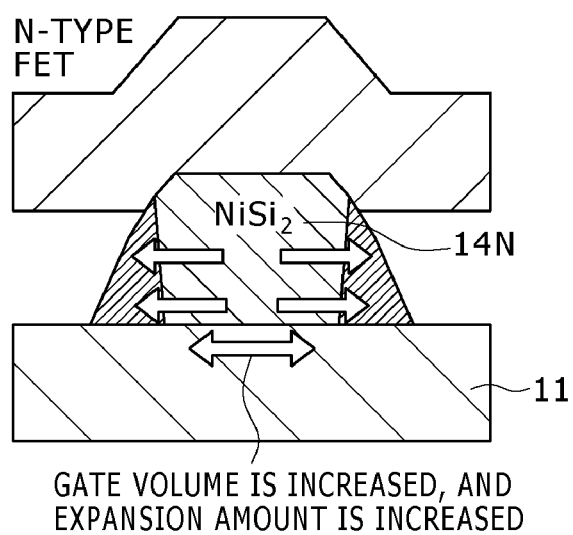

On the other hand, in the semiconductor device 1 as above, as shown in FIG. 3B, the sectional shape in the gate length direction of the gate electrode 14N of the N-type FET is a reversely tapered shape in which the gate length increases as one goes upwards from the surface of the semiconductor substrate 11. Therefore, since the gate electrode 14N is enlarged in volume as compared with a non-tapered gate electrode according to the related art, the expansion amount at the time of full-silicidation ($Ni_3Si$) can be enlarged. Consequently, a stress exerted on the channel region can be increased, and the ON current can be increased. In addition, since the gate electrode 14N is enlarged in volume, the concentration of nickel (Ni) to be silicided in relation to silicon is lowered, and optimum full-silicidation ($NiSi_2$) for the gate electrode 14N of the N-type FET can be realized.

Figure 3C:
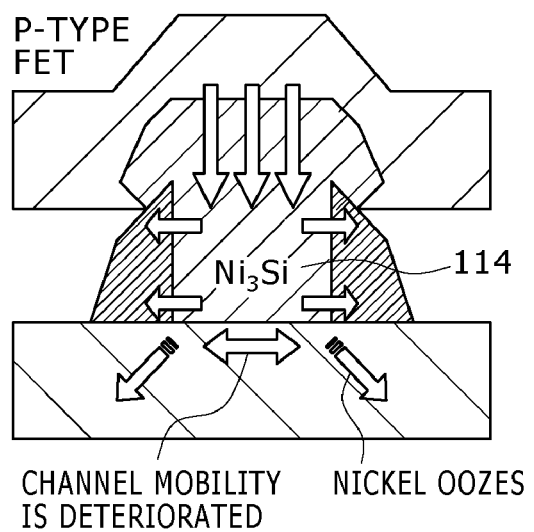

As shown in FIG. 3C, as a comparative example, the sectional shape in the gate length direction of a gate electrode 114 of a P-type FET according to the related art is a rectangular shape. Therefore, the expansion amount of the volume of the gate electrode 114 at the time of full-silicidation is large, so that oozing of nickel (Ni) into the channel region is generated, whereby channel mobility is deteriorated. Besides, since the gate electrode 114 is large in volume, the concentration of nickel (Ni) to be silicided in relation to silicon is lowered, and optimum full-silicidation ($Ni_3Si$) for the gate electrode 114 of the P-type FET is hard to realize.

Now, an embodiment of the method of manufacturing a semiconductor device based on the present invention will be described below, referring to manufacturing step sectional views shown in FIGS. 4A to 4S. Referring to FIGS. 4A to 4S, a 65 nm node CMOSFET will be described as an example.

As shown in FIG. 4A, device isolation regions 12 for isolating an N-type FET (for example, N-type MOSFET) formation region 11N and a P-type FET (for example, P-type MOSFET) formation region 11P from each other are formed in a semiconductor substrate 11. As the semiconductor substrate 11, for example, a silicon substrate is used. Naturally, a compound semiconductor substrate can also be used. Then, optimum channel impurities are introduced respectively into the formation regions 11N and 11P.

Next, as shown in FIG. 4B, a gate insulator film 13 is formed over the semiconductor substrate 11. The gate insulator film 13 includes, for example, a high dielectric constant film, examples of which includes a hafnium nitride silicate (HfSiON) film. This film is formed in a thickness of, for example, 3 nm by a CVD method, for example. Then, an electrode forming film 31 for forming gate electrodes is formed over the gate insulator film 13. The electrode forming film 31 includes, for example, a poly-silicon film. This film is formed in a thickness of, for example, 100 nm by a CVD method, for example.

Subsequently, as shown in FIG. 4C, the electrode forming film 31 is subjected to pre-doping. For example, the electrode forming film 31 in the N-type FET formation region 11N is doped with an N-type impurity, for example, phosphorus. This doping is carried out by, for example, an ion implantation method, with an implantation energy of, for example, 5 keV and in a dose of, for example, $5 \times 10^{15}$ atoms/$cm^2$.

Figure 4D:
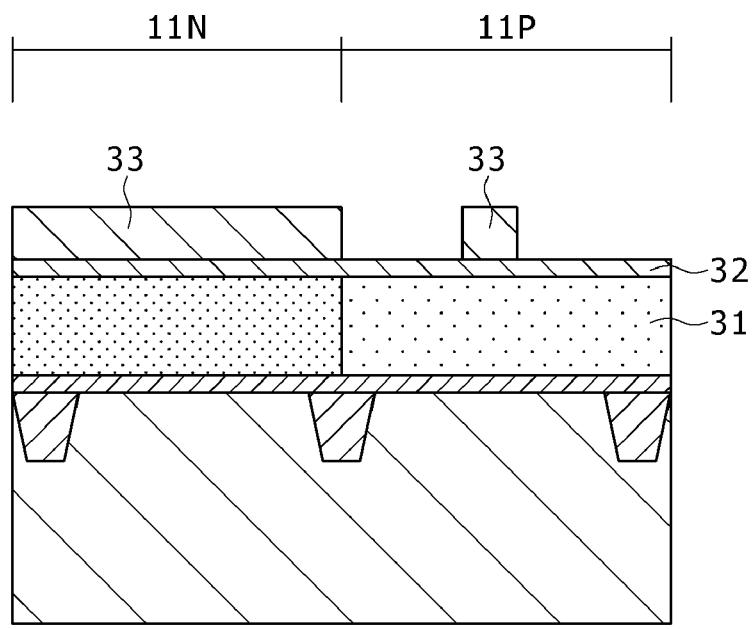
FIGS. 4A to 4S are manufacturing step sectional views for illustrating the embodiment of the method of manufacturing a semiconductor device based on the present invention.

Thereafter, as shown in FIG. 4D, a hard mask layer 32 is formed over the electrode forming film 31. The hard mask layer 32 includes, for example, a silicon nitride film, which is formed in a thickness of, for example, 60 nm and by a CVD method, for example. Then, a mask pattern 33 is formed by resist application and lithography technique. The mask pattern 33 covers the N-type FET formation region 11N and has a gate pattern in the P-type FET formation region 11P. In the lithography technique, for example, an ArF lithography is used, and a line pattern with a line width of, for example 50 nm is formed only in the P-type FET formation region 11P.

Figure 4E:
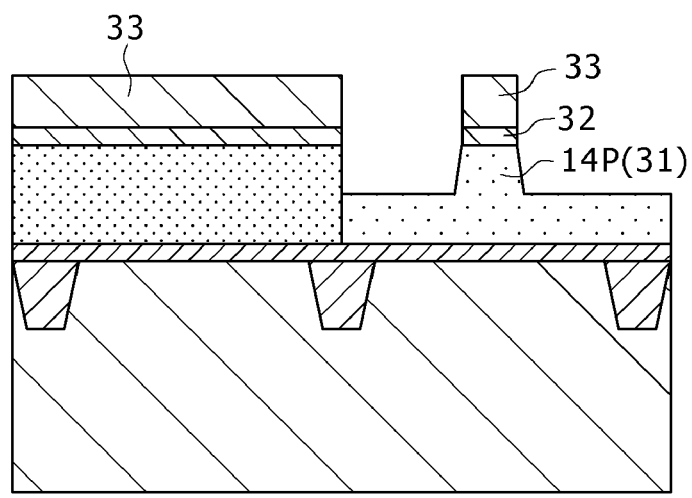
Figure 4F:
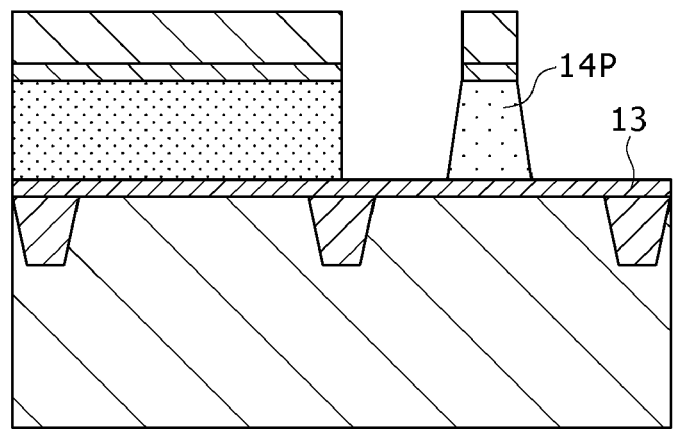

Next, as shown in FIGS. 4E and 4F, using the mask pattern 33 as an etching mask, the hard mask layer 32 and the electrode forming film 31 are etched. In this case, in order to process the electrode forming film 31 into a tapered shape, an etchant is controlled according to the timing during the gate processing.

A desired etched shape is obtained by dividing the etching conditions into a multiplicity of stages. As an example of the etching conditions, the etching is divided into two stages.

For example, as shown in FIG. 4E, as a first stage, hydrogen bromide (HBr) [flow rate: 180 $cm^3$/min], oxygen ($O_2$) [flow rate: 5 $cm^3$/min] and nitrogen ($N_2$) [flow rate: 10 $cm^3$/min] are used as an etching gas, and settings of a plasma power of 250 W, a bias power of 90 V, and an etching atmosphere pressure of 1.33 Pa are employed.

In this manner, the gate electrode 14P of the P-type FET is progressively processed so that its sectional shape will be a forwardly tapered shape (normal tapered shape). For achieving this, the etchant is controlled according to the timing during the processing of the gate electrode 14P. For example, the quantities of the etching gas supplied are controlled. At the time of etching an upper part of the gate electrode 14P, it is desirable to use such an etching atmosphere that no etching reactant gas adheres to side walls of the gate electrode 14P.

In a second stage of etching, for example, as shown in FIG. 4F, conditions for a more anisotropic etching atmosphere than that in the first stage are used. Specifically, hydrogen bromide (HBr) [flow rate: 300 cm$^3$/min], oxygen (O$_2$) [flow rate: 5 cm$^3$/min] and nitrogen (N$_2$) [flow rate: 10 cm$^3$/min] are used as an etching gas, and settings of a plasma power of 250 W, a bias power of 90 V, and an etching atmosphere pressure of 1.33 Pa are employed, whereby the sectional shape in the second stage can be made larger (in horizontal dimension) than the sectional shape in the first stage.

The second stage of etching is started by changing the etching conditions around the time when the first stage of etching is about to act on a lower part of the gate electrode 14P. In the second stage of etching, the reaction products are deposited on side walls of the gate electrode 14P processed, to become a protective film, which produces a subsidiary effect such as to suppress the progress of side etching, whereby the gate electrode 14P can be processed to have a forwardly tapered sectional shape.

Figure 4G:
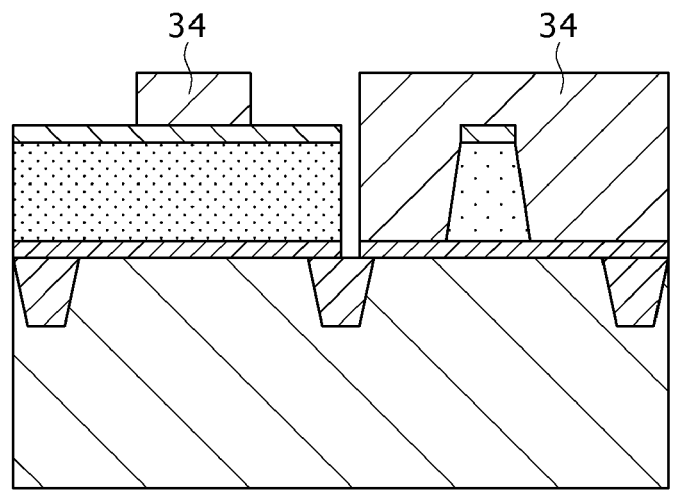

Subsequently, as shown in FIG. 4G, the mask pattern 33 (see FIG. 4F) used as the etching mask is peeled off, and a mask pattern 34 is formed by resist application and lithography technique. The mask pattern 34 covers the P-type FET formation region 11P, and forms a gate pattern in the N-type FET formation region 11N. In the lithography technique, for example, an ArF lithography technique is used, and a line pattern with a line width of, for example, 50 nm is formed only in the N-type FET formation region 11N.

Figure 4H:
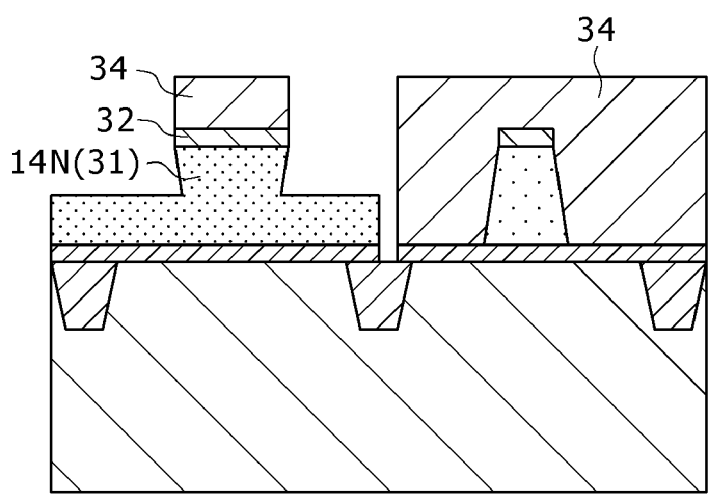
Figure 4I:
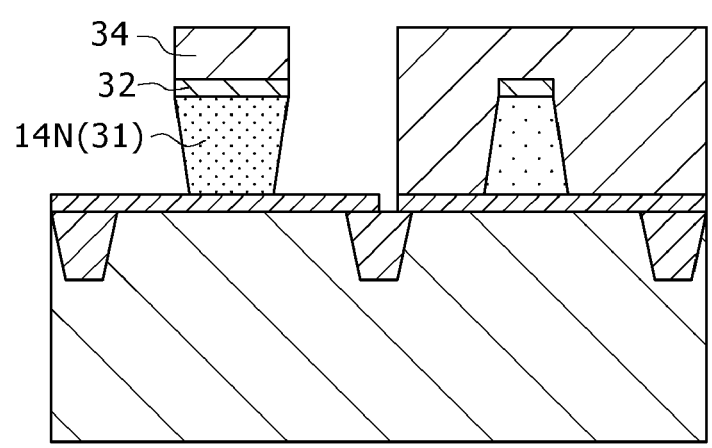

Thereafter, as shown in FIGS. 4H and 4I, using the mask pattern 34 as an etching mask, the hard mask layer 32 and the electrode forming film 31 are etched.

For example, in pre-doping applied to the electrode forming film 31, a doping species, for example, phosphorus is preliminarily enriched partially in a lower part of the electrode forming film 31, and an increase in etching rate in the area of higher phosphorus concentration is utilized, to thereby attain a reversely tapered shape (inverted tapered shape). For example, in the ion implantation, phosphorus is used as an ion species, and the settings of an implantation energy of 15 keV and a dose of 5×10$^{15}$/cm$^2$ are employed.

Or, alternatively, the electrode forming film 31 is processed into the reversely tapered shape by controlling the etchant according to the timing during the gate processing.

For example, the etching conditions are divided into a multiplicity of stages, thereby obtaining the desired reversely tapered shape. As an example of the etching conditions, the etching is divided into two stages.

For example, as shown in FIG. 4H, in the first stage of etching, HBr [flow rate: 300 cm$^3$/min], O$_2$ [flow rate: 5 cm$^3$/min] and N$_2$ [flow rate: 10 cm$^3$/min] are used as the etching gas, and settings of a plasma power of 250 W, a bias power of 90 V, and an etching atmosphere pressure of 1.33 Pa are employed.

In this manner, the gate electrode 14N of the N-type FET is progressively processed so that its sectional shape will be a reversely tapered shape. For this purpose, the etchant is controlled according to the timing during the processing of the gate electrode 14N. For example, the quantities of the etching gas supplied are controlled. At the time of etching an upper part of the gate electrode 14N, it is desirable to use such an etching atmosphere that the etching reactant gas adheres to side walls of the gate electrode 14P.

In the second stage of etching, for example, as shown in FIG. 4I, conditions for a more isotropic etching atmosphere than that in the first stage are used. In this case, HBr [flow rate: 180 cm$^3$/min], O$_2$ [flow rate: 5 cm$^3$/min] and N$_2$ [flow rate: 10 cm$^3$/min] are used as the etching gas, and settings of a plasma power of 250 W, a bias power of 90 V, and an etching atmosphere pressure of 1.33 Pa are employed, whereby the sectional shape in the second stage can be set to be smaller (in horizontal dimension) than the sectional shape in the first stage.

Thereafter, the mask pattern 34 is removed. Incidentally, the gate insulator film 13 may also be etched during the etching of each of the gate electrodes 14P, 14N. In the drawings, the condition before removal of the mask pattern 34 is shown.

Figure 4J:
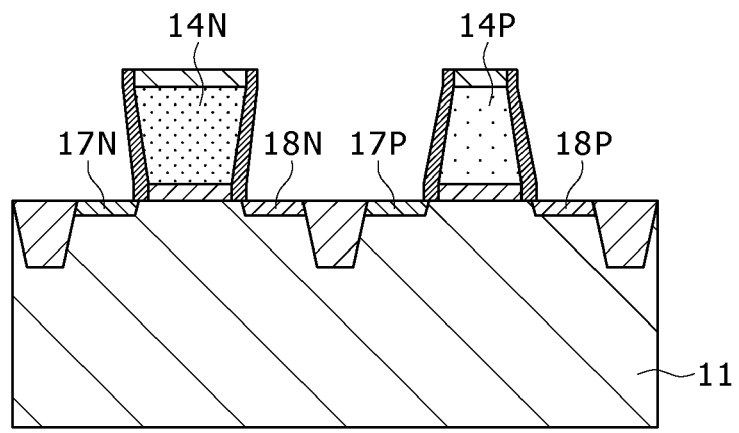

Next, as shown in FIG. 4J, offset spacers 15 are formed on side walls of the gate electrodes 14N, 14P. The offset spacers 15 are formed by, for example, a CVD method, in which a silicon nitride film is formed in a thickness of 8 nm, and is then subjected to dry etching. Subsequently, the P-type FET formation region 11p is masked with a resist (not shown), and the semiconductor substrate 11 is provided on both sides of the gate electrode 14N with source/drain extension pocket regions 17N, 18N by an ion implantation method. Then, the resist is removed, the N-type FET formation region 11N is masked with a resist (not shown), and the semiconductor substrate 11 is provided on both sides of the gate electrode 14P with source/drain extension pocket regions 17P, 18P by an ion implantation method. Thereafter, the resist is removed. Incidentally, of the two sets of source/drain extension pocket regions, either one may be formed earlier than the other.

Figure 4K:
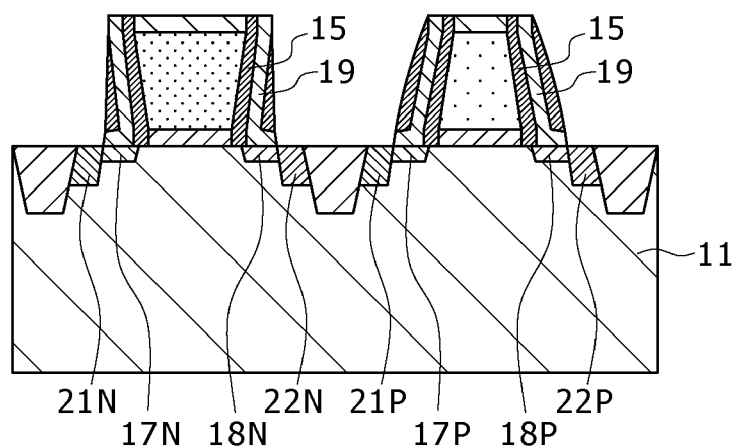

Subsequently, as shown in FIG. 4K, a side wall spacer 19 is formed on each of side walls of the gate electrodes 14N, 14P, with the offset spacer 15 interposed therebetween. The side wall spacers 19 are formed by, for example, a CVD method, in which a silicon nitride film is formed in a thickness of 8 nm, and successively a silicon oxide film is formed in a thickness of 25 nm, followed by anisotropic dry etching.

Next, the P-type FET formation region 11P is masked with a resist (not shown), and the semiconductor substrate 11 is provided on both sides of the gate electrode 14N with source/drain regions 21N, 22N by an ion implantation method, with the source/drain extension pocket regions 17N, 18N interposed therebetween. Then, the resist is removed, the N-type FET formation region 11N is masked with a resist (not shown), and the semiconductor substrate 11 is provided on both sides of the gate electrode 14P with source/drain regions 21P, 22P by an ion implantation method, with the source/drain extension pocket regions 17P, 18P interposed therebetween. This is followed by removal of the resist. Incidentally, of the two sets of source/drain regions, either one may be formed earlier than the other.

Thereafter, activating RTA is conducted. The RTA is carried out by, for example, spike annealing at 1050° C.

Figure 4L:
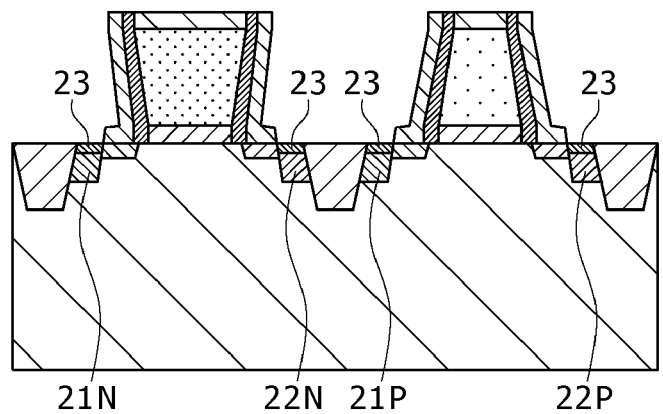

Subsequently, as shown in FIG. 4L, a silicide layer 23 is formed in each of the source/drain regions 21N, 22N, 21P, 22P. The silicide layer 23 is formed by forming a nickel (Ni) film on the source/drain regions 21N, 22N, 21P, 22P, and is subjected to a heat treatment (sintering) for performing a silicidation reaction. Here, the nickel film was formed in a thickness of, for example, 10 nm by sputtering, followed by the silicidation reaction at 450° C. It is favorable to perform a cleaning step for removing the oxide film formed on the source/drain regions 21N, 22N, 21P, 22P, before the formation of the silicide layer 23. In this case, the silicon oxide films of the side wall spacers 19 (see FIG. 4K) may be removed.

Figure 4M:
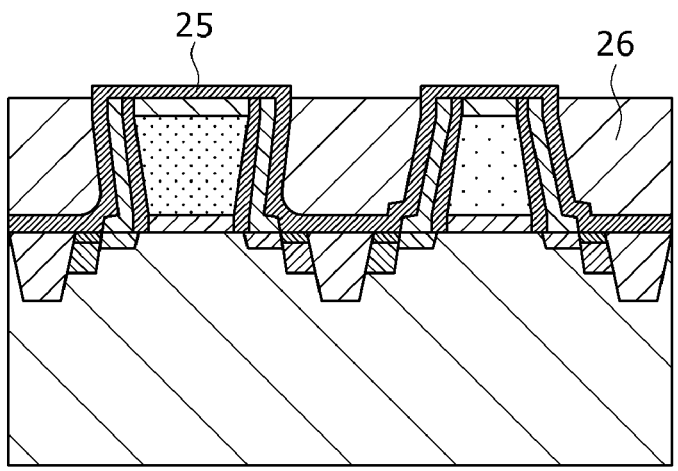

Next, as shown in FIG. 4M, a silicon nitride film 25 is formed over the whole surface area. Further, a silicon oxide film 26 is formed over the whole surface area so as to fill up the spacing between the gate electrodes. The silicon nitride film 25 is formed, for example, in a thickness of 20 nm by a CVD method, and the silicon oxide film 26 is formed, for example, in a thickness of 200 nm by a CVD method. Thereafter, the whole surface is flattened (planarized) by chemical mechanical polishing (CMP), the polishing being conducted until the silicon nitride film 25 is exposed. The drawing shows the condition after the polishing.

Figure 4N:
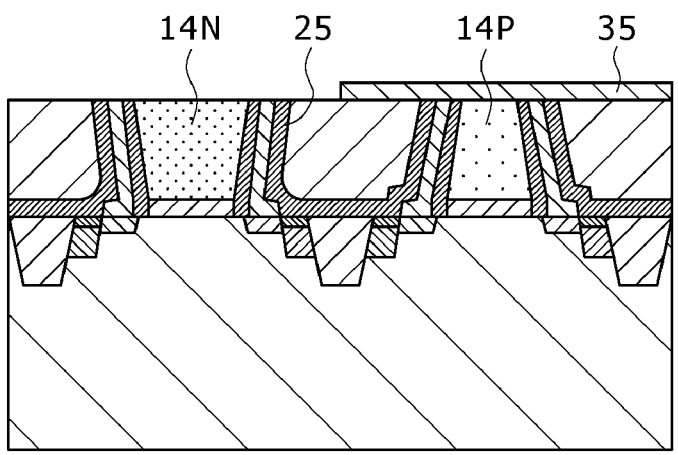

Subsequently, as shown in FIG. 4N, the silicon nitride film 25 and the like on the gate electrodes are selectively removed by dry etching. Then, a mask 35 for silicidation is formed so as to cover the gate electrode 14P. The mask 35 is formed, for example, by a method in which a silicon oxide film is formed in a thickness of 20 nm over the whole surface area by a CVD method, and a hole is opened therein on the upper side of the N-type FET formation region 11N by lithography technique and etching technique.

Figure 4O:
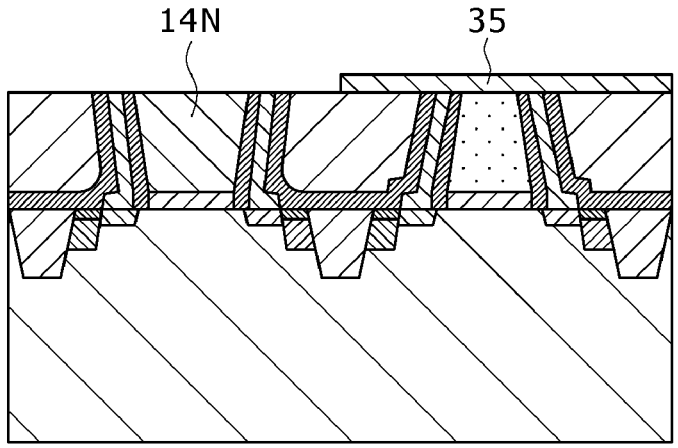

Thereafter, as shown in FIG. 4O, the gate electrode 14N is silicided. Specifically, a nickel film is formed, for example, in a thickness of 10 nm by sputtering, and a silicidation reaction is effected at 450° C., to form $NiSi_2$. Then, the mask 35 is removed by etching, for example.

Figure 4P:
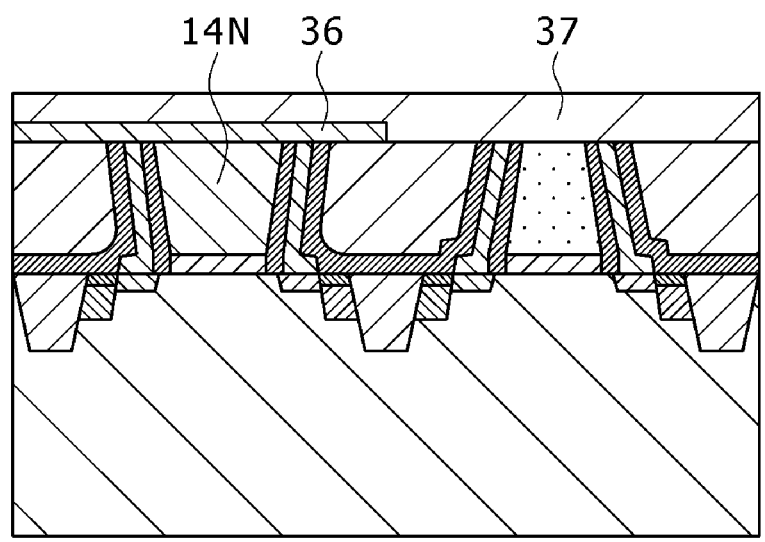

Next, as shown in FIG. 4P, a mask 36 for silicidation is formed so as to cover the gate electrode 14N. The mask 36 is formed, for example, by a method in which a silicon oxide film is formed in a thickness of 20 nm over the whole surface area by a CVD method, and a hole is opened therein on the upper side of the P-type FET formation region 11P by lithography technique and etching technique. Then, a nickel film 37 is formed, for example, in a thickness of 10 nm by sputtering.

Figure 4Q:
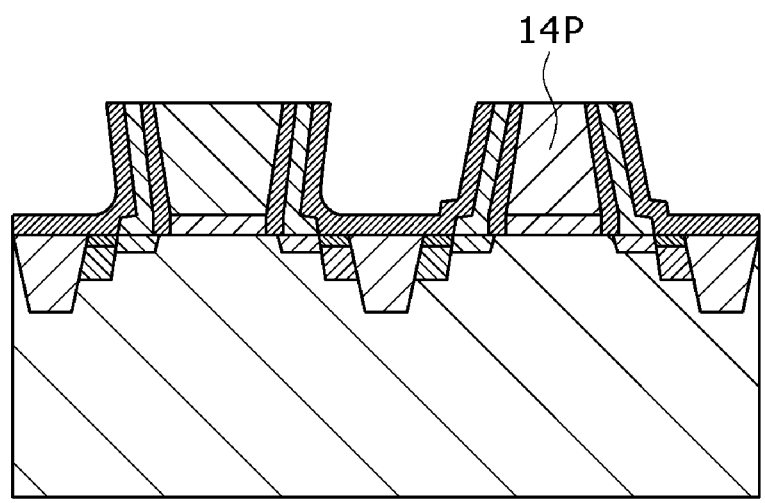

Subsequently, as shown in FIG. 4Q, the gate electrode 14P is silicided. For example, a silicidation reaction is effected at 450° C., to form $Ni_3Si$. Then, the mask 36 (see FIG. 4P) is removed by etching, for example.

Figure 4R:
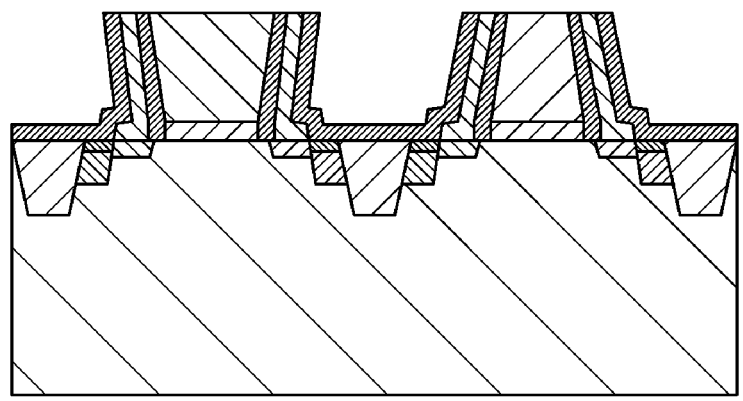
Figure 4S:
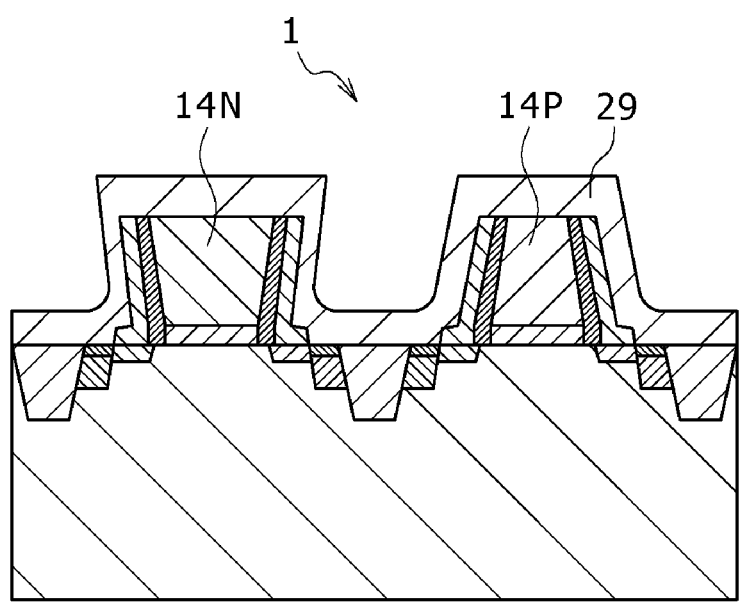

Thereafter, as shown in FIG. 4R, the silicon oxide film 26 (see FIG. 4M) is removed by dry etching.

Next, as shown in FIG. 4S, the silicon nitride film 25 (see FIG. 4M) is removed. Then, a high stress film 29 having a stress as a contact etching stop layer (CESL) is formed in a thickness of 60 nm, for example. In this manner, the semiconductor device 1 is completed in which the P-type FET gate electrode 14P and the N-type FET gate electrode 14N have undergone full-silicidation.

While the gate electrode 14P has been formed earlier and the gate electrode 14N formed later in the above-described manufacturing method, the gate electrode 14N may be formed earlier than the formation of the gate electrode 14P. Besides, while the full-silicidation of the gate electrode 14P has been conducted earlier than the full-silicidation of the gate electrode 14N in the above-described manufacturing method, the full-silicidation of the gate electrode 14N may be conducted earlier than the full-silicidation of the gate electrode 14P.

While the sectional shape in the gate length direction of the gate electrode 14N is a reversely tapered shape in the semiconductor device 1 as above, the side surfaces as viewed in the section along the gate length direction may be rectilinear or stepped. In other words, it suffices that the sectional shape is such that the gate length increases as one goes upwards from the side of the semiconductor substrate 11. Similarly, while the sectional shape in the gate length direction of the gate electrode 14P is a forwardly tapered shape in the foregoing, the side surfaces as viewed in the section along the gate length direction may be rectilinear or stepped. In other words, it suffices that the sectional shape is such that the gate length decreases as one goes upwards from the side of the semiconductor substrate 11.

It should be understood by those skilled in the art that various modifications, combinations, sub-combinations and alterations occur depending on design requirements and other factors insofar as they are within the scope of the appended claims or the equivalents thereof.

What is claimed is:

1. A semiconductor device comprising a semiconductor substrate with an N-type field effect transistor and a P-type field effect transistor, a gate electrode of said N-type field effect transistor and a gate electrode of said P-type field effect transistor having undergone full-silicidation,
wherein,
said gate electrode of said P-type field effect transistor has such a sectional shape in a gate length direction thereof that the gate length of said P-type field effect transistor decreases proceeding upwards from a surface of said semiconductor substrate, and
said gate electrode of said N-type field effect transistor has such a sectional shape in a gate length direction that the gate length of said N-type field effect transistor increases proceeding upwards from the surface of said semiconductor substrate.

2. A semiconductor device comprising a semiconductor substrate with an N-type field effect transistor and a P-type field effect transistor, a gate electrode of said N-type field effect transistor and a gate electrode of said P-type field effect transistor having undergone full-silicidation,
wherein,
said gate electrode of said P-type field effect transistor has a section having a forwardly tapered shape in relation to a surface of said semiconductor substrate, and
said gate electrode of said N-type field effect transistor has a section having a reversely tapered shape in relation to the surface of said semiconductor substrate.

3. The semiconductor device as set forth in claim 1, wherein said gate electrode of said P-type field effect transistor includes $Ni_3Si$.

4. The semiconductor device as set forth in claim 1, wherein said gate electrode of said N-type field effect transistor includes $NiSi_2$.

* * * * *